(12) United States Patent
Ando et al.

(10) Patent No.: US 10,748,742 B2
(45) Date of Patent: Aug. 18, 2020

(54) DEVICE FOR DUST EMITTING OF FOREIGN MATTER AND DUST EMISSION CAUSE ANALYSIS DEVICE

(71) Applicant: Hitachi High-Tech Corporation, Minato-ku, Tokyo (JP)

(72) Inventors: Hiroyuki Ando, Tokyo (JP); Yuta Asaga, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 700 days.

(21) Appl. No.: 14/762,689

(22) PCT Filed: Jan. 24, 2014

(86) PCT No.: PCT/JP2014/051522
§ 371 (c)(1),
(2) Date: Jul. 22, 2015

(87) PCT Pub. No.: WO2014/119483
PCT Pub. Date: Aug. 7, 2014

(65) Prior Publication Data
US 2015/0371817 A1 Dec. 24, 2015

(30) Foreign Application Priority Data

Jan. 30, 2013 (JP) ................................. 2013-015938

(51) Int. Cl.
*G06F 19/00* (2018.01)
*H01J 37/26* (2006.01)
(Continued)

(52) U.S. Cl.
CPC ............ *H01J 37/265* (2013.01); *H01J 37/18* (2013.01); *H01J 37/20* (2013.01); *H01J 37/28* (2013.01);
(Continued)

(58) Field of Classification Search
CPC ................................ H01J 37/265; H01J 37/18
(Continued)

(56) References Cited

U.S. PATENT DOCUMENTS 6,629,009 B1 * 9/2003 Tamaki ............ G05B 19/41875
700/108
6,650,409 B1 * 11/2003 Noguchii ........... G01N 21/9501
356/237.3
(Continued)

FOREIGN PATENT DOCUMENTS

EP 1 696 242 A1 8/2006
JP 8-111441 A 4/1996
(Continued)

OTHER PUBLICATIONS

International Search Report (PCT/ISA/210) dated Apr. 8, 2014, with English translation (two (2) pages).
(Continued)

*Primary Examiner* — Mohammad Ali
*Assistant Examiner* — Sheela Rao
(74) *Attorney, Agent, or Firm* — Crowell & Moring LLP

(57) ABSTRACT

In order to specify a dust emitting mechanism portion, a wafer must be provided near a mechanism portion in operation and the mechanism portion must be operated so that foreign matter sticks to a surface of the wafer. A mechanism that allows foreign matter to stick to a wafer by repeating operation of each of particular portions in a device and thus intentionally bringing about dust emission is provided. For example, the device includes a control device, a sample chamber in which a sample is processed, and a mechanism that loads and unloads a sample to and from the sample chamber, the mechanism has a plurality of portions, the control device has a script, and a particular portion of the
(Continued)

plurality of portions of the mechanism is repeatedly operated as the control device executes the script.

17 Claims, 15 Drawing Sheets

(51) Int. Cl.
| | |
|---|---|
| H01L 21/67 | (2006.01) |
| H01J 37/18 | (2006.01) |
| H01J 37/20 | (2006.01) |
| H01J 37/28 | (2006.01) |
| H01L 21/66 | (2006.01) |

(52) U.S. Cl.
CPC ............... *H01L 21/67253* (2013.01); *H01J 2237/0225* (2013.01); *H01J 2237/184* (2013.01); *H01J 2237/204* (2013.01); *H01J 2237/28* (2013.01); *H01L 22/12* (2013.01)

(58) Field of Classification Search
USPC ........................................................ 700/121
See application file for complete search history.

(56) References Cited

U.S. PATENT DOCUMENTS

| | | | | |
|---|---|---|---|---|
| 2003/0054573 | A1* | 3/2003 | Tanaka | H01L 21/67276 438/4 |
| 2005/0233477 | A1 | 10/2005 | Yamazaki et al. | |
| 2006/0195298 | A1* | 8/2006 | Ishizuka | G01R 31/2834 702/187 |
| 2012/0286463 | A1* | 11/2012 | Rastegar | G03F 1/66 269/289 R |
| 2013/0082177 | A1* | 4/2013 | Hiroi | G01N 23/2251 250/310 |
| 2014/0014036 | A1* | 1/2014 | Sonoda | C23C 14/042 118/712 |
| 2014/0135970 | A1* | 5/2014 | Kaushal | G05B 19/41875 700/121 |
| 2014/0163712 | A1* | 6/2014 | Waterman | H01L 21/67288 700/108 |

FOREIGN PATENT DOCUMENTS

| | | |
|---|---|---|
| JP | 2000-269108 A | 9/2000 |
| JP | 2005-197437 A | 7/2005 |
| JP | 2006-121030 A | 5/2006 |
| JP | 2006-237365 A | 9/2006 |

OTHER PUBLICATIONS

Korean-language Office Action issued in counterpart Korean Application No. 10-2018-7020793 dated Sep. 10, 2018 with English Translation (14 pages).

Unverified English Translation of document B4 (JP 2005-197437 A previously filed on Jul. 22, 2015) (18 pages).

\* cited by examiner

[FIG. 1]
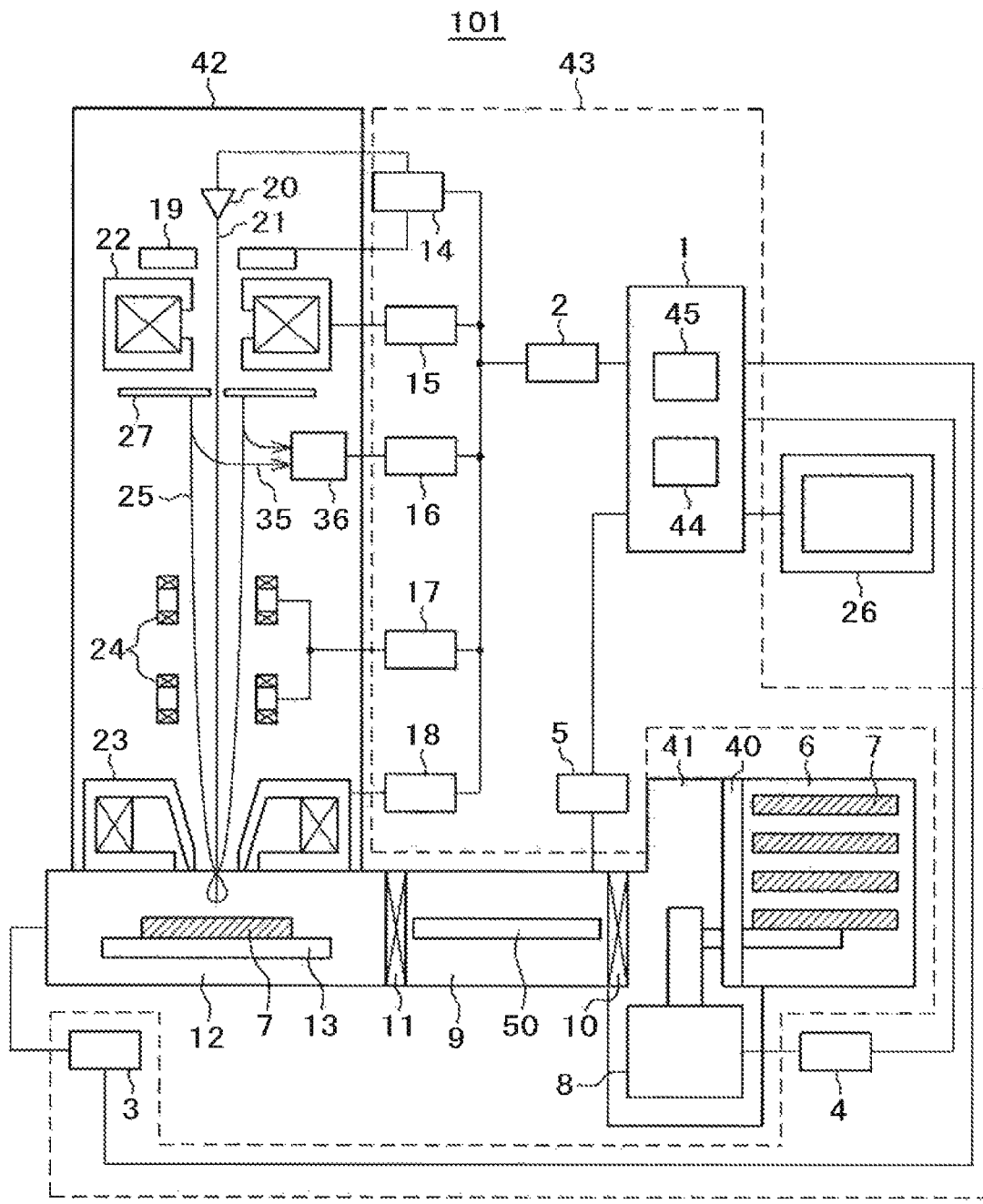

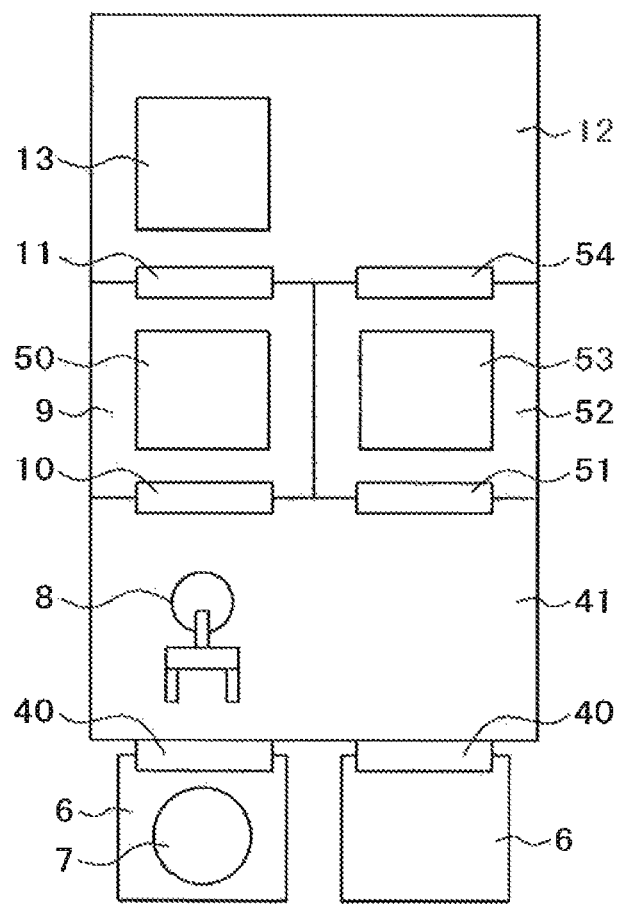
[FIG. 2]

[FIG. 3]

| OPERATION CONTENT | NAME OF SOFTWARE COMPONENT |
|---|---|
| DOOR 40 IS OPENED. | FP-OP |
| DOOR 40 IS CLOSED. | FP-CL |
| WAFER 7 IN FOUP 6 IS TAKEN OUT BY TRANSPORT ROBOT 8. | FP-RO |
| WAFER 7 HELD BY TRANSPORT ROBOT 8 IS RECOVERED TO FOUP 6. | RO-FP |
| WAFER 7 HELD BY TRANSPORT ROBOT 8 IS MOVED TO IN FRONT OF GATE VALVE 10. | RO-LB1 |
| WAFER 7 HELD BY TRANSPORT ROBOT 8 IS MOVED TO IN FRONT OF GATE VALVE 51. | RO-LB2 |
| WAFER 7 HELD BY TRANSPORT ROBOT 8 IS LOADED ON HOLDER 50. | RO-LC1 |
| WAFER 7 HELD BY TRANSPORT ROBOT 8 IS LOADED ON HOLDER 53. | RO-LC2 |
| WAFER 7 ON HOLDER 50 IS TAKEN OUT BY TRANSPORT ROBOT 8. | LC1-RO |
| WAFER 7 ON HOLDER 53 IS TAKEN OUT BY TRANSPORT ROBOT 8. | LC2-RO |
| INSIDE OF LOAD LOCK CHAMBER 9 IS BROUGHT TO ATMOSPHERIC CONDITION. | LC1-AR |
| INSIDE OF LOAD LOCK CHAMBER 52 IS BROUGHT TO ATMOSPHERIC CONDITION. | LC2-AR |
| LOAD LOCK CHAMBER 9 IS EVACUATED. | LC1-EV |
| LOAD LOCK CHAMBER 52 IS EVACUATED. | LC2-EV |
| GATE VALVE 10 IS OPENED. | GB11-OP |
| GATE VALVE 10 IS CLOSED. | GB11-CL |
| GATE VALVE 51 IS OPENED. | GB21-OP |
| GATE VALVE 51 IS CLOSED. | GB21-CL |
| GATE VALVE 11 IS OPENED. | GB12-OP |
| GATE VALVE 11 IS CLOSED. | GB12-CL |
| GATE VALVE 54 IS OPENED. | GB22-OP |
| GATE VALVE 54 IS CLOSED. | GB22-CL |
| STAGE 13 IS MOVED TO SIDE OF LOAD LOCK CHAMBER 9. | ST-MV1 |
| STAGE 13 IS MOVED TO SIDE OF LOAD LOCK CHAMBER 52. | ST-MV2 |
| WAFER 7 ON HOLDER 50 IS LOADED ON STAGE 13. | LC1-SC |
| WAFER 7 ON HOLDER 53 IS LOADED ON STAGE 13. | LC2-SC |
| WAFER 7 ON STAGE 13 IS UNLOADED TO HOLDER 50. | SC-LC1 |
| WAFER 7 ON STAGE 13 IS UNLOADED TO HOLDER 53. | SC-LC2 |

[FIG. 4]
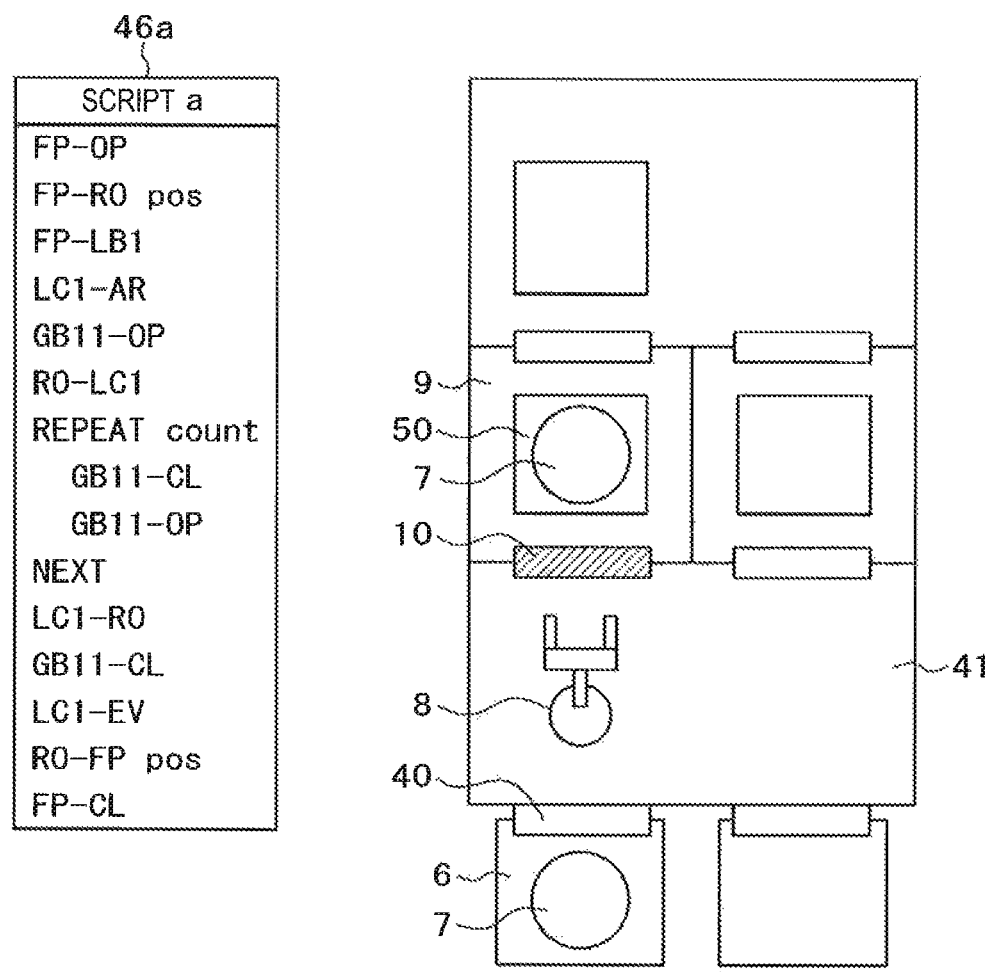

[FIG. 5]
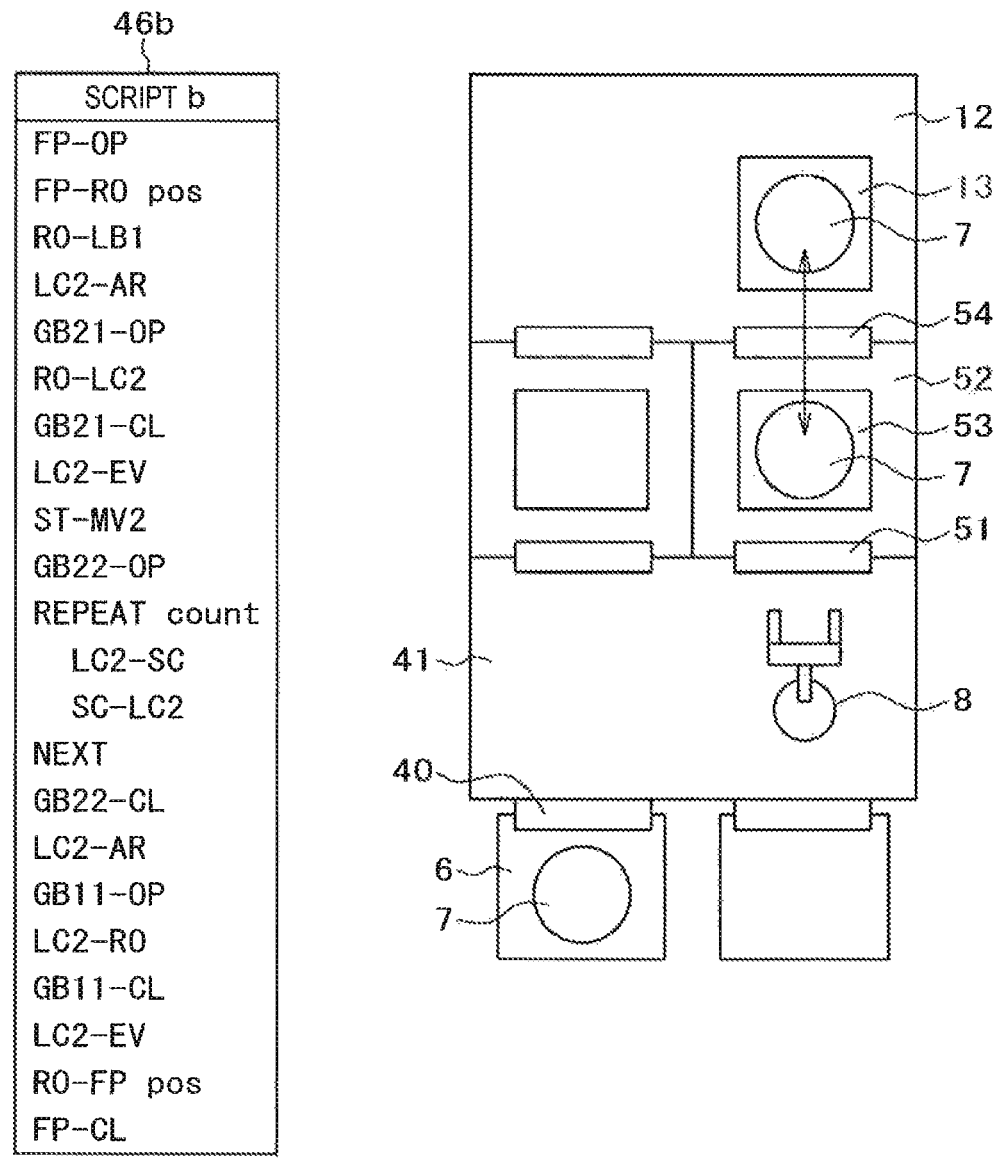

[FIG. 6]
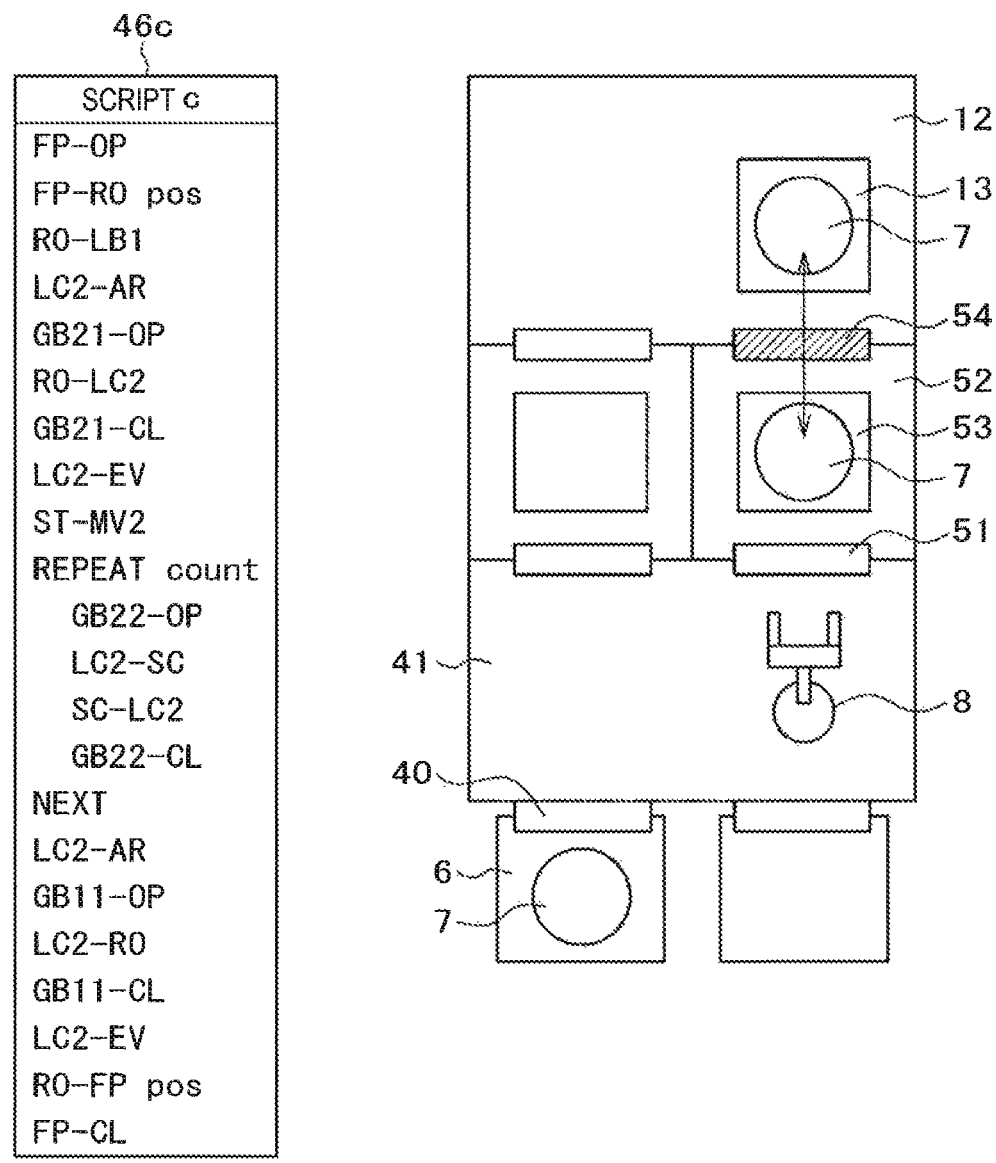

[FIG. 7]
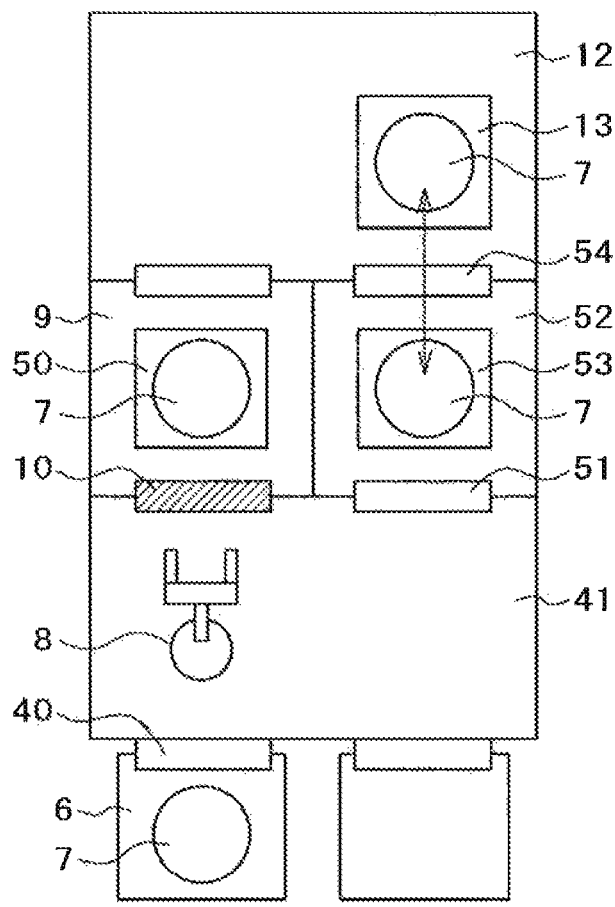
[FIG. 8]
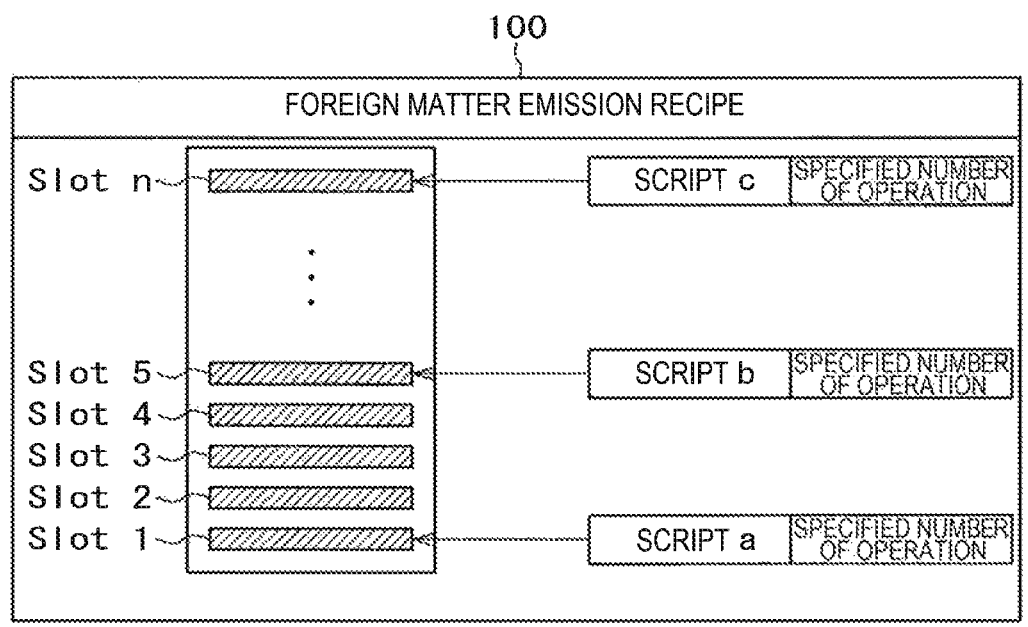

[FIG. 9]
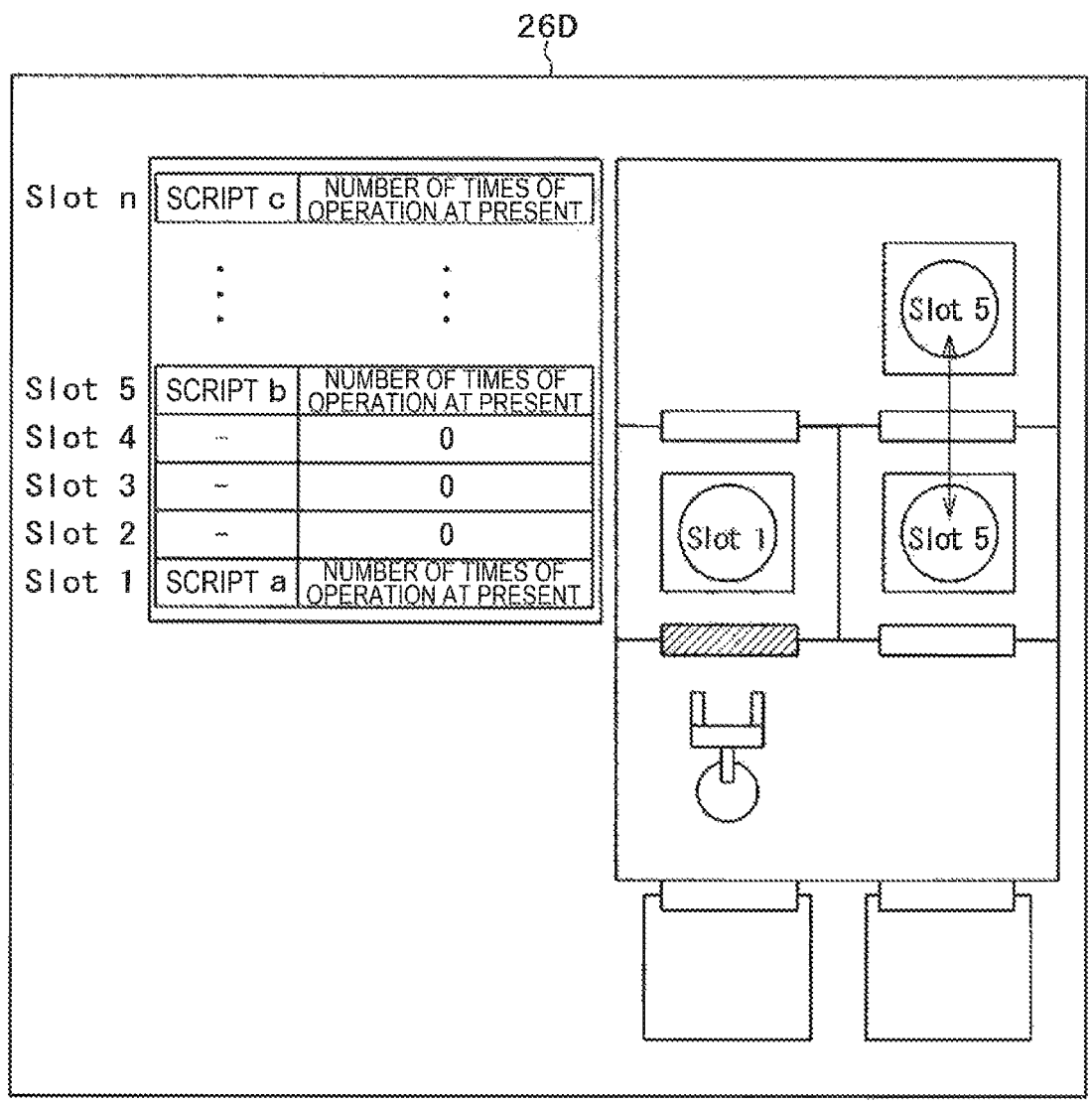

[FIG. 10]
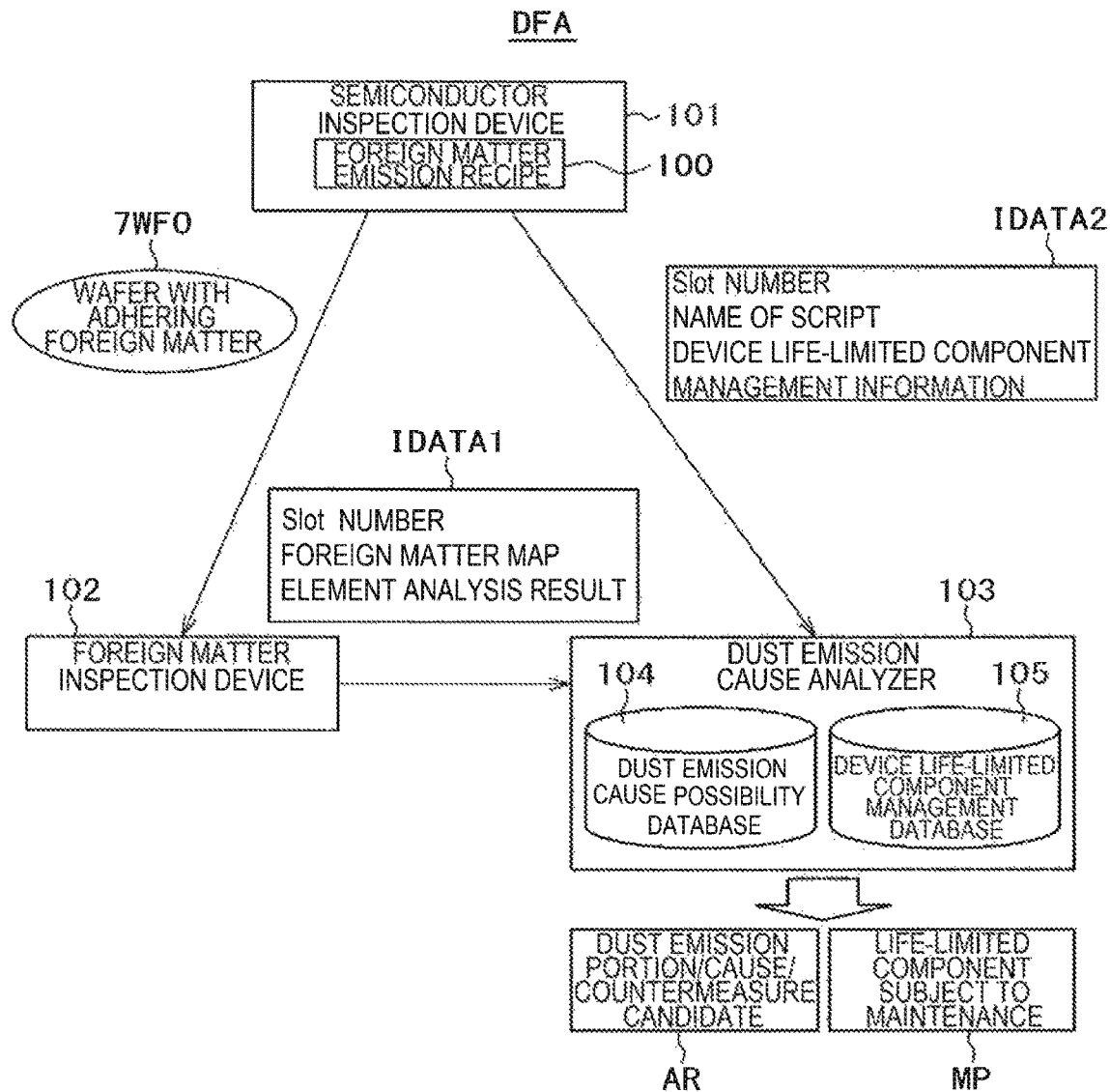
[FIG. 11]

[FIG. 12]
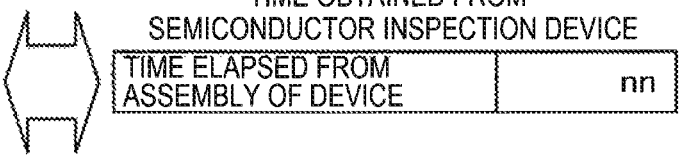

[FIG. 13A]
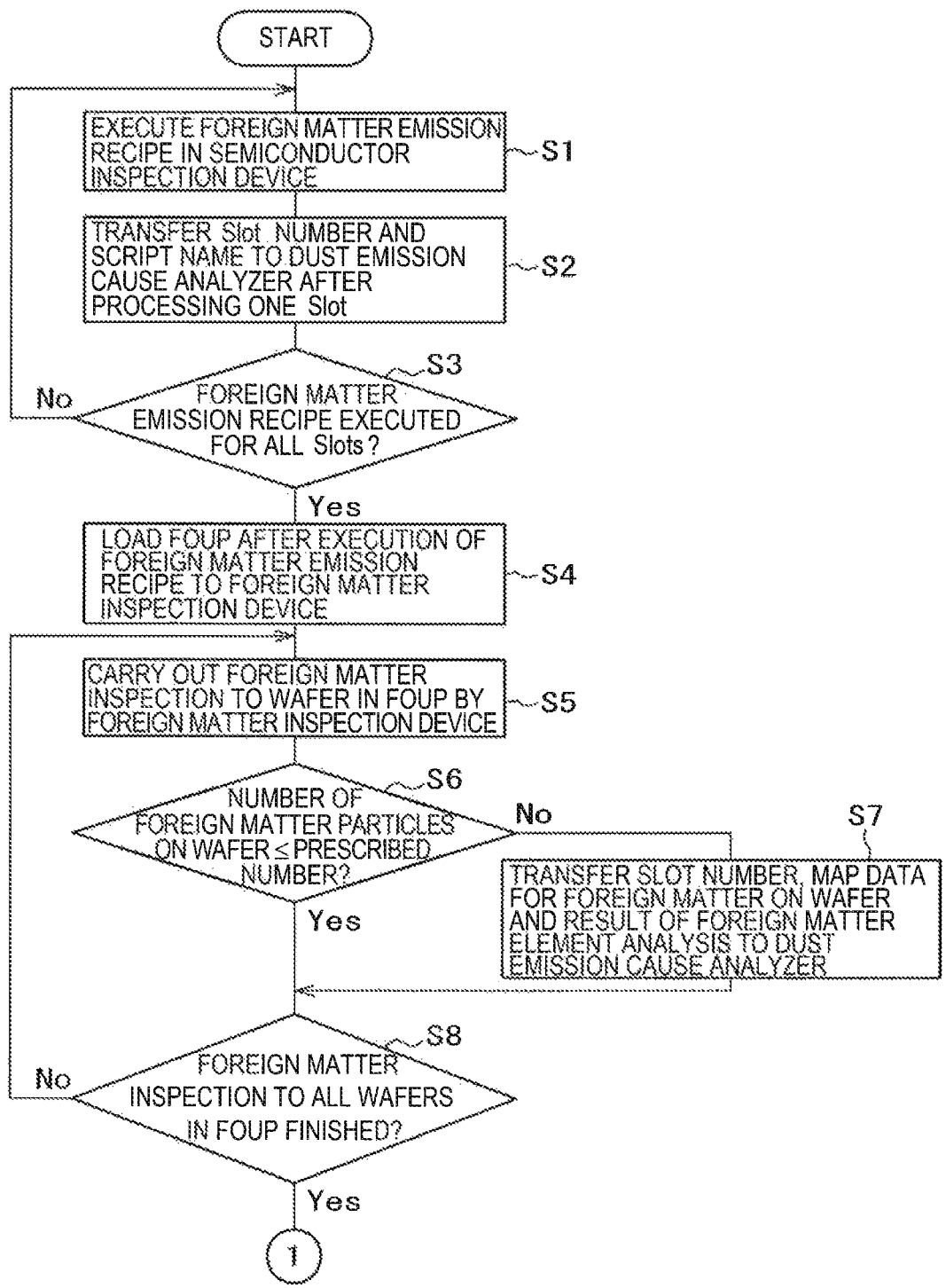

[FIG. 13B]
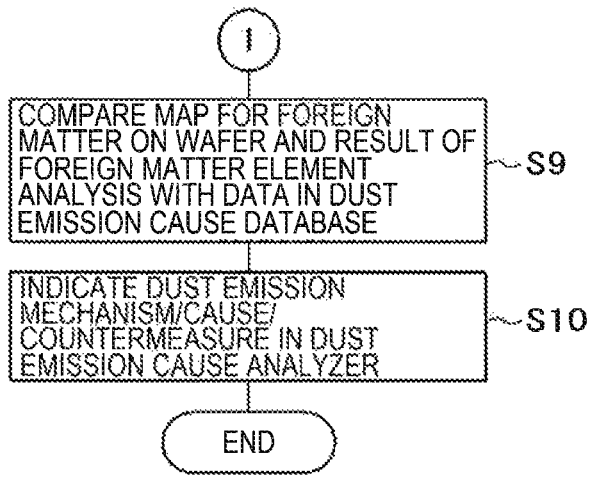
[FIG. 14]
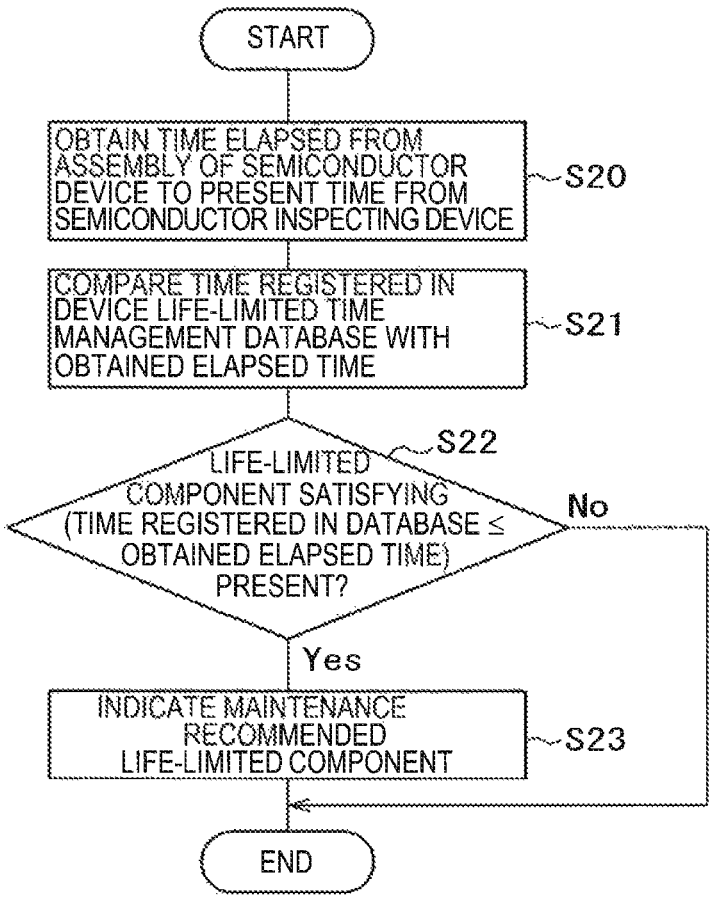

[FIG. 15]
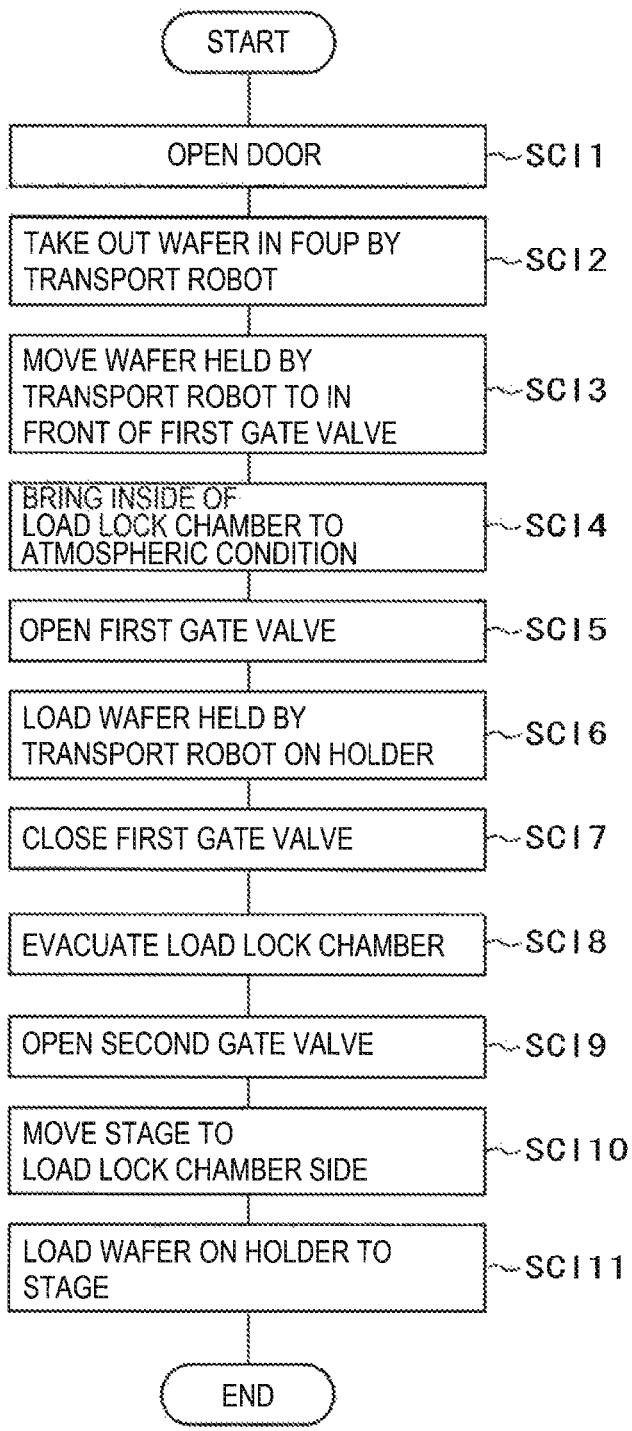

[FIG. 16]
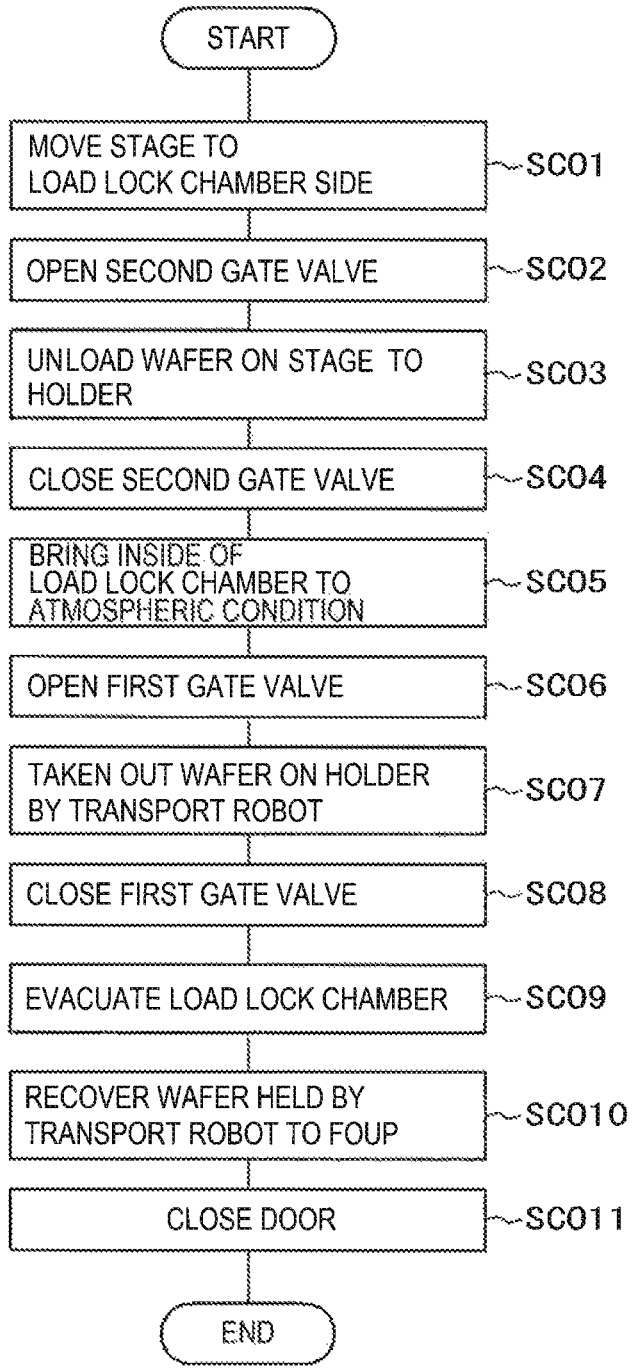

[FIG. 17]
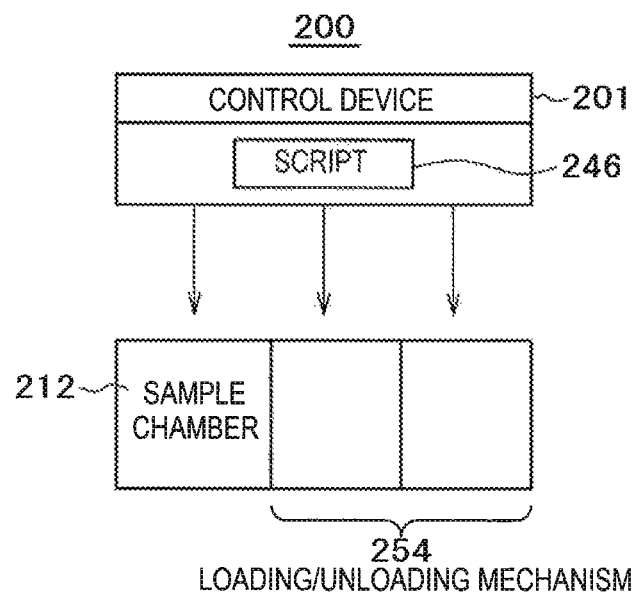

DEVICE FOR DUST EMITTING OF FOREIGN MATTER AND DUST EMISSION CAUSE ANALYSIS DEVICE

TECHNICAL FIELD

The present invention relates to a device and may be applied for example to a device that emits foreign matter and a device that can obtain a source of foreign matter.

BACKGROUND ART

After resist coating, exposure, and development, evaluation of the process is carried out by measuring a pattern width and the like using a CD-SEM (Critical Dimension-Scanning Electron Microscope). More specifically, a semiconductor inspection device such as the CD-SEM is used to determine whether a pattern on a sample such as a semiconductor wafer is correctly formed. In recent years, as finer patterns have been formed on samples such as semiconductor wafers, even very small adhering foreign matter cannot be overlooked.

The user checks for foreign matter day by day and starts steps for process evaluation if the number of foreign matter particles adhering to a wafer is less than a prescribed number. A dummy wafer is used to check for adhering foreign matter (Patent Literature 1). If however the prescribed number is exceeded, the use of the device is prohibited and a service engineer is called. The service engineer examines for a source and a cause of foreign matter emission, specifies a dust emission portion, and then carries out cleaning or replaces parts. Then, the device is operated for a predetermined period and the user gets back the device once it is confirmed that no more foreign matter is emitted.

CITATION LIST

Patent Literature

PTL 1: JP-A-8-111441

SUMMARY OF INVENTION

Technical Problem

In a device such as a semiconductor inspection device that handles samples such as semiconductor wafers, foreign matter may stick to a sample when the sample is loaded to a sample chamber in which the sample is inspected or a processing chamber in which the sample is processed (hereinafter simply referred to as the "sample chamber") or when the sample is unloaded and recovered to its original position. This happens for various causes such as dust emission from an evacuating mechanism and dust emission by friction at a stage mechanism. A combination of a plurality of operations may generate dust in some cases, and it is difficult to find out the cause. Various mechanism portions operate when a sample is loaded to the sample chamber from a sample storing/transporting box such as a FOUP (Front Opening Unified Pod) in the form of a wafer cassette or when a sample is unloaded from the sample chamber to the sample storing/transporting box. Dust is emitted when any of the mechanisms operates and the dust sticks on a sample surface as foreign matter.

In order to specify a mechanism portion that emits dust, a sample must be provided near a mechanism portion in operation and the mechanism portion must be operated so that foreign matter adheres to a surface of the sample. According to a current method employed by a service engineer, a sample is manually provided in a particular position in a device and then a mechanism portion is manually operated. The current method conducted is not efficient in finding out a cause of dust emission because of the manual operations. Here, the manual operations refer to carrying out operations one by one while a service engineer inputs each command line from an operation terminal.

Other problems and novel features will become apparent from the description and the attached drawings.

Solution to Problem

Among solutions to the problem disclosed in the present application, a general structure of a typical solution will be described briefly as follows.

More specifically, a device has a mechanism that allows foreign matter to stick to a sample by repeating operation of each of particular portions and thus intentionally bringing about dust emission.

Advantageous Effects of Invention

According to the above-described device, a source and a cause of foreign matter emitted from inside the device can readily be specified.

BRIEF DESCRIPTION OF DRAWINGS

FIG. 1 is a side view for illustrating a general structure of a semiconductor inspection device according to an example of the invention.

FIG. 2 is a top view for illustrating a general structure of the semiconductor inspection device according to the example.

FIG. 3 is a table of software components according to the example.

FIG. 4 is a view showing a first example of a script of a combination of software components and repeating operation for dust emission according to the example.

FIG. 5 is a view showing a second example of a script of a combination of software components and repeating operation for dust emission according to the example.

FIG. 6 is a view showing a third example of a script of a combination of software components and repeating operation for dust emission according to the example.

FIG. 7 is a view showing repeating operation for dust emission in consideration of efficiency according to the example.

FIG. 8 is a view showing an example of a foreign matter emission recipe according to the example.

FIG. 9 is a view showing the foreign matter emission recipe in FIG. 8 in the process of execution at a GUI.

FIG. 10 is a diagram showing a system structure configured to specify a dust emission cause of a foreign matter emission source according to the example.

FIG. 11 is a view showing a dust emission cause possibility database according to the example.

FIG. 12 is a view showing a device life-limited component time management database according to the example.

FIG. 13A is a chart for illustrating a flow until possibilities for a foreign matter emission source and a cause thereof are found according to the example.

FIG. 13B is a chart for illustrating the flow until possibilities for a foreign matter emission source and a cause thereof are found according to the example.

FIG. 14 is a chart for illustrating a flow until a maintenance recommended component is extracted according to the example.

FIG. 15 is a flowchart for illustrating a loading operation in the semiconductor inspection device according to the example.

FIG. 16 is a flowchart for illustrating an unloading operation in the semiconductor inspection device according to the example.

FIG. 17 is a diagram showing a structure according to the example.

DESCRIPTION OF EMBODIMENTS

Now, an embodiment and an example of the invention will be described in conjunction with the drawings. Note that in the following description, the same elements are designated by the same reference characters, and their description is not repeated.

FIG. 17 is a diagram showing a structure according to an embodiment of the invention. A device 200 has a control device 201, a sample chamber 212 in which a sample is processed, and a mechanism 254 that loads and unloads the sample to and from the sample chamber 212, the mechanism 254 has a plurality of portions, the control device 201 has a script 246, and the control device 201 executes the script 246, so a particular portion of the plurality of portions of the mechanism 254 repeatedly operate. In this way, dust emission is intentionally brought about and foreign matter can be adhered to a sample. In addition, the source of the emitted foreign matter and the cause thereof can readily be specified.

Here, the script 246 is a simple program of software components arranged in order that allows a certain group of operations to be executed, and the software component is a unit that allows one operation in loading and unloading operations to be executed alone.

EXAMPLES

In the following, a semiconductor inspection device that includes a CD-SEM will be described as an example but the invention is not limited to the example and may be applied for example to other devices that use charged particle beams (such as a transmission electron microscopy, a scanning transmission electron microscopy, an electron-beam lithography system, an ion microscopy, and a focused ion beam processing device) and devices that do not use charged particle beams (such as an inspection device, a manufacturing device, a processing device, an evaluation device, and a measuring device). The sample may be for example a reticle used to mask exposure light from an exposure device and a TFT substrate for a liquid crystal display or an organic EL display other than the semiconductor wafer.

Structure

FIG. 1 is a side view for illustrating a general structure of the semiconductor inspection device according to the example. The semiconductor inspection device 101 includes a tube 42 that stores an optical system, a sample chamber 12, a load lock chamber 9, a mini environment 41, a control system 43, and a display/editor 26.

The control device 1 carries out control for an optical system controller 2, a stage controller 3, a sample transport controller 4, and a sample exchange chamber controller 5 based on acceleration voltage input from a user interface (not shown) by the operator, sample (semiconductor device) information, measuring position information, wafer cassette information and the like.

The sample transport controller 4 responds to an instruction received from the control device 1 and controls a transport robot 8 in the mini environment 41 so that an arbitrary wafer 7 from a FOUP 6 is moved to the position of a holder 50 of the load lock chamber (sample exchange chamber) 9. The FOUP 6 is provided with a door 40 and has a closing/opening mechanism. The control device 1 is allowed to control opening/closing of the door 40 of the FOUP 6.

The sample exchange chamber controller 5 carries out such control that gate valves 10 and 11 are opened/closed in association with the movement of the wafer 7 coming into/out from the load lock chamber 9. Furthermore, the sample exchange chamber controller 5 controls a vacuum pump (not shown) that evacuates the inside of the sample exchange chamber 9 and creates a vacuum equal to that of the sample chamber 12 in the sample exchange chamber 9 when the gate valve 11 opens. The wafer 7 entered in the sample exchange chamber 9 is sent to the sample chamber 12 through the gate valve 11 and secured on the stage 13. The mechanism controlled by the sample transport controller 4 or the sample exchange controller 5 is also referred to as the loading/unloading mechanism.

The optical system controller 2 responds to an instruction from the control device 1 and controls a high voltage controller 14, a condenser lens controller 15, an amplifier 16, a deflection signal controller 17, and an objective lens controller 18.

An electron beam 21 extracted from an electron source 20 through an extracted electrode 19 is focused by a condenser lens 22 and an objective lens 23 and irradiated upon the wafer 7 provided on the sample stage 13. The electron beam 21 is directed on the wafer 7 for one-dimensional or two-dimensional scanning by a deflector 24 that has received a signal from the deflection signal controller 17.

Secondary charged particles 25 released from the wafer 7 because of the irradiation of the electron beam 21 upon the wafer 7 are converted into secondary electrons 35 by a secondary electron converting electrode 27 and the secondary electrons 35 are captured by a secondary charged particle detector 36 and used as a luminance signal for a display screen of the display/editor 26 through the amplifier 16.

A deflection signal from the display/editor 26 and a deflection signal from the deflector 24 are synchronized, so that a pattern shape on the wafer can be reproduced at the display/editor 26.

Operations (1) Loading Operation

FIG. 2 is a top view of the semiconductor inspection device according to the example. FIG. 15 is a flowchart for illustrating a loading operation by the semiconductor inspection device according to the example. FIG. 16 is a flowchart for illustrating an unloading operation by the semiconductor inspection device according to the example.

As shown in FIG. 2, the semiconductor inspection device 101 has a plurality of load lock chambers 9 and can be connected with a plurality of FOUPs 6. A wafer 7 in a FOUP 6 is loaded into the sample chamber 12 (hereinafter referred to as the "loading operation"). The loading operation is performed by carrying out the following operations in order as shown in FIG. 15.

The door 40 of the FOUP 6 is opened (step SCI1). The wafer 7 in the FOUP 6 is taken out by the transport robot 8 (step SCI2). The wafer 7 held by the transport robot 8 is moved to a position in front of the gate valve 10 (step SCI3). The inside of the load lock chamber 9 is brought to an atmospheric condition (step SCI4). The gate valve 10 is opened (step SCI5). The wafer 7 held by the transport robot 8 is loaded on the holder 50 (step SCI6). The gate valve 10 is closed (step SCI7). The load lock chamber 9 is evacuated (step SCI8). The gate valve 11 of the load lock chamber 9 is opened (step SCI9). The stage 13 is moved to the side of the load lock chamber 9 (step SCI10). The wafer 7 on the holder 50 is loaded onto the stage 13 (step SCI11). The gate valve 11 is closed.

(2) Measuring Operation

Then, the size of a pattern present on the wafer 7 is measured.

(3) Unloading Operation

The wafer 7 after measuring in the sample chamber 12 is recovered to the FOUP 6 (hereinafter referred to as the "unloading operation"). The unloading operation is performed by carrying out the following operations in order as shown in FIG. 16.

The stage 13 is moved to the side of the load lock chamber 9 (step SCO1). The gate valve 11 is opened (step SCO2). The wafer 7 on the stage 13 is unloaded to the holder 50 (step SCO3). The gate valve 11 is closed (step SCO4). The inside of the load lock chamber 9 is brought to an atmospheric condition (step SCO5). The gate valve 10 is opened (step SCO6). The wafer 7 on the holder 50 is taken out by the transport robot 8 (step SCO7). The gate valve 10 is closed (step SCO8). The load lock chamber 9 is evacuated (step SCO9). The wafer 7 held by the transport robot 8 is recovered to the FOUP 6 (step SCO10). The door 40 of the FOUP 6 is closed (step SCO11).

Method of Specifying Dust Emission Source

It is highly likely that foreign matter adhered on a wafer is picked up during an operation in the loading or unloading operation. Therefore, a method of specifying a dust emission source by intentionally repeating operation of a particular portion and thus bringing about dust emission will be described in the following.

FIG. 3 is a table (library) of software components according to the example. Each of the software components shown in FIG. 3 is a unit that allows one operation in the loading and unloading operations to be executed alone. These software components are registered in a storage 44 such as a hard disk and a semiconductor non-volatile memory in the control device 1. The software components are registered in the storage 44 before the device is delivered to the user and before a script that will be described is edited or executed at latest. In order to create repeating operation for a particular portion of the loading and unloading operations, software components may be edited on the display/editor 26 to create a script. The script refers to a simple program of software components arranged in order that allows a certain group of operations to be executed. The script can be registered in the storage 44 similarly to the software components. The script is registered in the storage 44 before the device is delivered to the user and before a service engineer executes the script to specify a dust emission source at latest. The script is executed by a CPU (Central Processing Unit) 45 in the control device 1.

FIGS. 4, 5, and 6 each show an example of a script produced by combining software components and repeating operation for dust emission according to the example.

A first script (script a) 46a shown in FIG. 4 carries out the following operations. The door 40 is opened (FP-OP). The wafer 7 in the FOUP 6 is taken out by the transport robot 8 (FP-RO pos). Here, the "pos" refers to the position (slot number) of the wafer in the FOUP 6. The wafer 7 held by the transport robot 8 is moved to a position in front of the gate valve 10 and stopped (RO-LB1). The inside of the load lock chamber 9 is brought to an atmospheric condition (LC1-AR). The gate valve 10 is opened (GB11-OP). The wafer 7 held by the transport robot 8 is loaded onto the holder 50 (RO-LC1). The operation of opening the gate valve 10 (GB11-OP) and the operation of closing the gate valve 10 (GB11-CL) are repeated a specified number of times in this state. The specified number of repetition is achieved by executing software components in the first script 46a, REPEAT count and NEXT. The system allows the script writer to freely change the specified number. The purpose of the operations of the first script 46a is to check whether dust is emitted by the operation of opening/closing the gate valve 10. Foreign matter emitted by opening/closing the gate valve 10 if any sticks to the wafer 7 on the holder 50. The wafer 7 with the adhering foreign matter is recovered to the FOUP 6 by the next operation after the operation is repeated the specified number of times. The wafer 7 on the holder 50 is taken out by the transport robot 8 (LC1-RO). The gate valve 10 is closed (GB11-CL). The load lock chamber 9 is evacuated (LC1-EV). The wafer 7 held by the transport robot 8 is recovered to the FOUP 6 (RO-FP pos). The door 40 is closed (FP-CL).

A second script (script b) 46b shown in FIG. 5 carries out the following operations. The door 40 is opened (FP-OP). The wafer 7 in the FOUP 6 is taken out by the transport robot 8 (FP-RO pos). The wafer 7 held by the transport robot 8 is moved to a position in front of a gate valve 51 and stopped (RO-LB1). A load lock chamber 52 is brought to an atmospheric condition (LC2-AR). The gate valve 51 is opened (GB21-OP). The wafer 7 held by the transport robot 8 is loaded onto a holder 53 (RO-LC2). The gate valve 51 is closed (GB21-CL). The load lock chamber 52 is evacuated (LC2-EV). The stage 13 is moved to the side of the load lock chamber 52 (ST-MV2). A gate valve 54 is opened (GB22-OP). In this state, the wafer 7 on the holder 53 is loaded to the stage 13 (LC2-SC). The wafer 7 on the stage 13 is unloaded to the holder 53 (SC-LC2). The operations are repeated a specified number of times. The purpose of the operations of the second script 46b is to check whether dust is emitted by repeating the operations of loading and unloading the holder 53. After repeating the operations the specified number of times, the wafer 7 is recovered to the FOUP 6. The operation of recovering the wafer 7 to the FOUP 6 is carried out by the operations of the software components after NEXT in the script b shown in FIG. 5. The operations can readily be understood by referring to FIG. 3, and therefore a description thereof is not provided.

A third script (script c) 46c shown in FIG. 6 carries out the following operations. The door 40 is opened (FP-OP). The wafer 7 in the FOUP 6 is taken out by the transport robot 8 (FP-RO pos). The wafer 7 held by the transport robot 8 is moved to a position in front of the gate valve 51 and stopped (RO-LB1). The load lock chamber 52 is brought to an atmospheric condition (LC2-AR). The gate valve 51 is opened (GB21-OP). The wafer 7 held by the transport robot 8 is loaded onto the holder 53 (RO-LC2). The gate valve 51 is closed (GB21-CL). The load lock chamber 52 is evacuated (LC2-EV). The stage 13 is moved to the side of the load lock chamber 52 (ST-MV2). In this state, the gate valve 54 is opened (GB22-OP). The wafer 7 on the holder 53 is loaded onto the stage 13 (LC2-SC). The wafer 7 on the stage 13 is unloaded to the holder 53 (SC-LC2). The gate valve 54 is closed (GB22-CL). The operations are repeated a specified number of times. The purpose of carrying out the operations of the third script 46c is to check whether dust is emitted by combining the operation of loading/unloading the holder 53 and the operation of opening/closing the gate valve 54. After repeating the operations the specified number of times, the wafer 7 is recovered to the FOUP 6. As for the operation of recovering the wafer 7 to the FOUP 6, the software components after LC2-AR in the third script 46c in FIG. 6 are the same as those of the second script 46b in FIG. 5, and therefore a description thereof is not provided.

By changing the combination of repeating mechanisms as shown by the difference between the second script 46b shown in FIG. 5 and the third script 46c shown in FIG. 6, the dust emission portion and the cause and mechanism thereof can be isolated more clearly.

FIG. 7 is a view showing an image of the repeating operation for dust emission in consideration of efficiency according to the example. The operations shown in FIG. 7 are a combination of the first script 46a shown in FIG. 4 and the second script 46b shown in FIG. 5. These operations overlap those described in connection with FIGS. 4 and 5, and therefore a description thereof is not provided. As shown in FIG. 7, as for the repeating operation, a plurality of operations can be executed simultaneously. In this way, the processing time can significantly be shortened.

FIG. 8 shows an example of a foreign matter emission recipe according to the example. A foreign matter emission recipe 100 is produced by allocating the scripts shown in FIGS. 4, 5, and 6 and the like to wafers in the FOUP 6 and registering them in the storage 44 as one executable format. A plurality of wafers are present in the FOUP 6 and numbered as slot 1, slot 2 to slot n in an ascending order from the lower side. In the example shown in FIG. 8, the script a, the script b, and the script c are allocated to the slot 1, slot 5, and slot n, respectively to form one recipe. When this recipe is executed, the wafer at the slot 1 is taken out from the FOUP 6 and the operation of the script a shown in FIG. 4 is repeated a specified number of times. Simultaneously with the start of the operation of the script a, the wafer at the slot 5 is taken out from the FOUP 6, and the operation of the script b shown in FIG. 5 is repeated a specified number of times. After the operation to the wafer at the slot 5 ends and the wafer is recovered to the FOUP 6 (the end of the operation of the script b), the wafer at the slot n is taken out from the FOUP 6, and the operation of the script c shown in FIG. 6 is repeated a specified number of times. When the operation of the script c ends and the wafer is recovered to the FOUP 6, the recipe ends.

FIG. 9 shows a screen image at the display/editor while the execution of the foreign matter emission recipe in FIG. 8 is in progress. The display/editor indicates slot numbers in the FOUP 6, the names of scripts allocated to the slot numbers, and the number of times of operation at the present time on the screen 26D shown in FIG. 9 by a GUI (Graphical User Interface). The number of times of operation at the present time is updated every time one repeating operation is carried out. The portion where the repeating operation is in progress at present in the semiconductor inspection device 101 is also indicated. The portion in operation in the semiconductor inspection device 101 and time required before the recipe ends can be estimated based on the information displayed by the GUI on the screen 26D. In addition, a script to be allocated to a slot number in the FOUP 6 and the number of times of operation can readily be set by the GUI.

In the foreign matter emission recipe 100, scripts for repeating operations of a plurality of portions that form the loading and unloading mechanism are allocated to the slots. Wafers stored in the slots are inspected using a foreign matter inspection device and if a wafer with adhering foreign matter is found, a dust emission portion (dust emission source) can be specified from the script corresponding to the slot that stores the wafer.

Dust Emission Cause Specifying System

FIG. 10 is a view showing a structure of a system that specifies a dust emission cause for a foreign matter emission source according to the example. The system DFA includes the semiconductor inspection device (first device) 101, the foreign matter inspection device (second device) 102, and a dust emission cause analyzer (third device) 103. The dust emission cause analyzer is implemented by a CPU, a storage, a program, and the like. Note however that the functions of the foreign matter inspection device 102 and the dust emission cause analyzer 103 may be put together in the semiconductor inspection device 101. Alternatively, the function of the dust emission cause analyzer 103 may be provided in the semiconductor inspection device 101. Furthermore, the function of the dust emission cause analyzer 103 may be formed by a CPU, a storage, a program, and the like in a host computer that collectively manages the devices such as the semiconductor inspection device 101 and the foreign matter inspection device 102. The semiconductor inspection device 101 has the foreign matter emission recipe 100 shown in FIG. 8 and outputs a wafer 7WFO that may have foreign matter adhered thereto after the end of the operations of the foreign matter emission recipe 100. The wafer 7WFO is processed by the foreign matter inspection device 102, data IDATA1 including a slot number, a foreign matter map, and a result of element analysis, and the like for the wafer 7WFO is output to the dust emission cause analyzer 103, and the data IDATA1 becomes an input to the dust emission cause analyzer 103. The dust emission cause analyzer 103 has a dust emission cause database (first database) 104 and a device life-limited component management database (second database) 105. The device life-limited component management database 105 may be provided in a different device (fourth device) from the dust emission cause analyzer 103. The semiconductor inspection device 101 outputs data IDATA2 that includes a slot number, a script name, device life-limited component management information, and the like to the dust emission cause analyzing layer 103. The device life-limited component management information includes the elapsed time of the life-limited component from assembly of the device.

FIG. 11 shows a content of a dust emission cause possibility database 104 according to the example. The dust emission cause database 104 has foreign matter maps 1041, element analysis results 1042, and dust emission mechanisms/causes 1043 with respect to the element analysis results, and countermeasures 1044 accumulated therein. The dust emission cause database 104 has accumulated information about foreign matter emitted in the past. The dust emission cause analyzer 103 compares a foreign matter map and an element analysis result as output data from the foreign matter inspection device 102 with the foreign matter maps 1041 and the element analysis results 1042 accumulated in the dust emission cause database 104 and outputs (indicates) an analysis result AR including a dust emission portion, a possible dust emission mechanism/cause, and a countermeasure (countermeasure candidate). Using the foreign matter maps, the distribution and size of foreign matter particles sticking to the wafer and the distributions and sizes of foreign matter particles registered in the dust emission cause database 104 are compared. In the element analysis, the elements of the foreign matter particles sticking to the wafer and the elements of foreign matter particles registered in the dust emission cause database 104 are compared. The comparison allows the dust emission portion (dust emission location) for the foreign matter and the dust emission cause to be readily obtained. The process until the foreign matter emission source is specified is established, so that the cause and a countermeasure (solution) thereto may be found without requiring much time.

FIG. 12 is a view showing a content of the device life-limited component time management database according to the example. The device life-limited time management database 105 has recommended maintenance time 1052 for life-limited components 1051 in the mechanism in the semiconductor inspection device 101 registered therein. The device life-limited time management database 105 is provided because if maintenance is not performed to a life-limited component beyond its recommended maintenance time in the semiconductor inspection device 101, wear of the component may give rise to emission of foreign matter. The dust emission cause analyzer 103 for example compares recommended maintenance time ea for a life-limited component A in the device life-limited time management database 105 with elapsed time nn from assembly of the device obtained from the semiconductor inspection device 101 and determines that the recommended maintenance time for the life-limited component A is exceeded if nn is equal to or more than ea. Then, recommended maintenance time eb for a life-limited component B is compared with nn. If nn is equal to or more than eb, it means that the recommended maintenance time for the life-limited component B is exceeded. In this way, recommended maintenance time for a life-limited component in the semiconductor inspection device 101 and time elapsed from the assembly of the device are compared and if the recommended maintenance time is exceeded, a maintenance recommended component (life-limited component subject to maintenance) MP is announced (indicated). In this way, time to exchange life-limited components can readily be known.

FIGS. 13A and 13B are charts for illustrating a flow until a foreign matter emission source and a possible foreign matter emission cause are found according to the example. In the semiconductor inspection device 101, the foreign matter emission recipe 100 is performed (step S1). After processing one slot, the slot number and the script name are transferred to the dust emission cause analyzer 103 (step S2). Then, it is determined if execution of the foreign matter emission recipe 100 to all the slots is over (step S3). This is to determine whether execution of all the scripts shown in FIG. 9 is over. After processing to all is over, the FOUP 6 after execution of the foreign matter emission recipe 100 is loaded to the foreign matter inspection device 102 (step S4). In the foreign matter inspection device 102, all the wafers in the FOUP 6 are subjected to foreign matter inspection (step S5). It is determined whether the number of foreign matter particles on the wafer is equal to or less than a prescribed number (step S6). The prescribed number is different among users and can therefore be customized. If the number of foreign matter particles on a wafer is equal to or more than the prescribed number, the slot number of the wafer, the foreign matter map data on the wafer, and the foreign matter element analysis result are transferred to the dust emission cause analyzer 103 (step S7). The processing (steps S5, S6, and S7) is carried out until foreign matter inspection to all the wafers in the FOUP 6 is over (step SB). The foreign matter map on the wafer and the foreign matter element analysis result are compared with the foreign matter maps and the foreign matter element analysis result data in the dust emission cause database 104 for all the wafers (step S9) and a dust emission mechanism, a cause, and a countermeasure are indicated in the dust emission cause analyzer 103 (step S10).

FIG. 14 is a chart for illustrating a flow until a maintenance recommended component is extracted according to the example. Time elapsed from assembly of the semiconductor inspection device 101 to the present time is obtained from the semiconductor inspection device (step 20). Then, time registered in the device life-limited time management database 105 and the time obtained in step S20 are compared (step S21). It is determined whether there is a life-limited component whose elapsed time from the assembly of the device obtained from the semiconductor inspection device 101 is equal to or more than the time registered in the device life-limited time management database 105 (step S22). If there is a life-limited component beyond its useful time, the life-limited component recommended for maintenance is indicated (step S23). The maintenance recommended component is extracted by the dust emission cause analyzer 103 but the device life-limited time management database 105 may be provided in another device (fourth device) and the device (fourth device) may carry out the operation.

While the invention achieved by the inventor has been described specifically based on an embodiment and an example, it is to be understood that the invention is not limited to the above-described embodiment and example and various changes may be made.

REFERENCE SIGNS LIST 200 device
201 control device
212 sample chamber
246 script
254 loading/unloading mechanism

The invention claimed is:
1. A device comprising:
a control device;
a sample chamber for fixing a sample of a semiconductor wafer, a reticle, or a TFT substrate to a stage and processing;
a sample exchange chamber;
a mechanism that loads and unloads the sample to and from the sample chamber through the sample exchange chamber;
a user interface,
wherein the mechanism has a plurality of portions,
the control device stores a foreign matter emission recipe composed of a plurality of scripts for causing the plurality of portions to perform an operation,
the plurality of scripts are associated with a plurality of samples, and
the control device executes the foreign matter emission recipe, so that a particular portion of the plurality of portions of the mechanism is operated multiple times without interruption in a foreign matter generation test operation, and at least one other of the plurality of portions of the mechanism is operated multiple times without interruption in the foreign matter generation test operation, so that the foreign matter emitted during the foreign matter generation test operation sticks to the plurality of samples,
the control device outputs information indicating a storage position in a sample storage container for storing the plurality of samples to which the foreign matter is attached to the user interface.

2. The device according to claim 1, wherein the plurality of portions are adapted to repeatedly operate simultaneously.

3. The device according to claim 1, wherein the script is a program of software components arranged in order that allows a certain group of operations to be executed, and the software component is a unit that allows one operation in loading and unloading operations to be executed alone.

4. The device according to claim 3, further comprising a display/editor, the device being capable of creating the script by combining the software components by the display/editor.

5. The device according to claim 3, further comprising a display/editor, the device being capable of displaying a portion in operation at present while the mechanism operates and a number of times of operation at the display/editor.

6. The device according to claim 5, wherein
the foreign matter emission recipe can allocate a script and a repeating number of times for the repeating operation to each of a plurality of samples by a GUI function of the display/editor.

7. The device according to claim 1, further comprising a detector that detects charged particles released from the sample when the sample is irradiated with a charged particle beam.

8. The device according to claim 1, wherein the foreign matter emission recipe intentionally promotes dust emission.

9. The device according to claim 1, wherein the control device is configured to output at least two or more of information indicating the storage position, information indicating the script, information indicating number of repetition operations, and information indicating the portion to the user interface, while the foreign matter emission recipe is executed.

10. The device according to claim 1, wherein the control device is configured to output at least three or more of information indicating the storage position, information indicating the script, information indicating number of repetition operations, and information indicating the portion to the user interface, while the foreign matter emission recipe is executed.

11. The device according to claim 1, wherein the control device is configured to set information indicating the script corresponding to the information indicating the storage position and information indicating number of repetition operations from the user interface.

12. The device according to claim 1, wherein the scripts with different particular portions whose operation is to be repeated are allocated to a different storage position in the sample storage container in order to specify a dust emission portion.

13. The device according to claim 1, where the storage position of the storage container corresponds to a portion having a different mechanism so that the dust emission portion can be specified from the storage position.

14. A system comprising:
a first device having a foreign matter emission recipe;
a second device that inspects foreign matter; and
a third device having a first database,
wherein the first database has a map of foreign matter emitted in the past, an element analysis result thereof, a dust emission mechanism, and a cause accumulated therein,
the first device includes a control device, a sampler chamber for fixing a sample of a semiconductor wafer, a reticle, or a TFT substrate to a stage and processing, a sample exchange chamber, a mechanism that loads and unloads the sample to and from the sample chamber through the sample exchange chamber, and a user interface,
the mechanism has a plurality of portions,
the control device stores a foreign matter emission recipe composed of a plurality of scripts for causing the plurality of portions to perform an operation,
the plurality of scripts are associated with a plurality of samples, and
the control device executes the foreign matter emission recipe, so that a particular portion of the plurality of portions of the mechanism is operated multiple times without interruption in a foreign matter generation test operation, and at least one other of the plurality of portions of the mechanism is operated multiple times without interruption in the foreign matter generation test operation so that the foreign matter emitted during the foreign matter generation test operation sticks to the plurality of samples,
the control device outputs information indicating a storage position in a sample storage container for storing the plurality of samples to which the foreign matter is attached to the user interface,
the second device analyzes the foreign matter at the sample and transfers a foreign matter map and an element analysis result to the third device, and
the third device compares the map of foreign matter emitted in the past and the element analysis result accumulated in the first database with the transferred foreign matter map and element analysis result and obtains a dust emission mechanism and a cause.

15. The system according to claim 14, wherein the first database further has a countermeasure to foreign matter emitted in the past accumulated therein, and
the third device compares the mechanism and cause of past dust emission accumulated in the first database with the obtained dust emission mechanism and cause and obtains a countermeasure.

16. The system according to claim 14, wherein the third device has a second database that stores life-limited component recommended maintenance time in each mechanism in the first device, obtains device life-limited component management information from the first device, detects a component beyond recommended maintenance time being present in the first device based on the life-limited component recommended time from the second database and the device life-limited component management information obtained from the first device, and displays a maintenance recommended component.

17. The system according to claim 14, further comprising a fourth device, the fourth device having a second database that stores life-limited component recommended maintenance time in each mechanism in the first device, obtaining device life-limited component management information from the first device, detecting a component beyond recommended maintenance time being present in the first device based on the life-limited component recommended time from the second database and the device life-limited component management information obtained from the first device, and displaying a maintenance recommended component.

* * * * *